us007746158B2

United States Patent
Morishita et al.

(10) Patent No.: US 7,746,158 B2
(45) Date of Patent: Jun. 29, 2010

(54) DRIVING DEVICE OF VOLTAGE DRIVE TYPE SEMICONDUCTOR DEVICE

(75) Inventors: Hidetoshi Morishita, Toyota (JP); Hideo Yamawaki, Toyota (JP); Yuu Suzuki, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 197 days.

(21) Appl. No.: 11/920,149

(22) PCT Filed: May 2, 2006

(86) PCT No.: PCT/JP2006/309530

§ 371 (c)(1),
(2), (4) Date: Nov. 9, 2007

(87) PCT Pub. No.: WO2006/121143

PCT Pub. Date: Nov. 16, 2006

(65) Prior Publication Data

US 2009/0021294 A1    Jan. 22, 2009

(30) Foreign Application Priority Data

May 11, 2005    (JP)    ............................. 2005-138964

(51) Int. Cl.
*H03K 17/687* (2006.01)
(52) U.S. Cl. ...................................... 327/434; 327/437
(58) Field of Classification Search .................. 327/427, 327/434, 436, 437, 108, 112
See application file for complete search history.

(56) References Cited

U.S. PATENT DOCUMENTS

| 6,400,126 | B1 * | 6/2002 | Zuniga et al. | ............... 323/282 |
| 7,372,685 | B2 * | 5/2008 | Beck et al. | .................. 361/93.1 |
| 7,408,398 | B2 * | 8/2008 | Sander | ....................... 327/427 |

FOREIGN PATENT DOCUMENTS

| JP | 5-48584 | 6/1993 |
| JP | 6-78525 | 3/1994 |
| JP | 10-70878 | 3/1998 |
| JP | 2001-223571 | 8/2001 |
| JP | 2001-308199 | 11/2001 |

* cited by examiner

*Primary Examiner*—Hai L Nguyen
(74) *Attorney, Agent, or Firm*—Finnegan, Henderson, Farabow, Garrett & Dunner, LLP

(57) ABSTRACT

A driving device of an IGBT includes a high potential side switch device group having a plurality of switch devices and, one end of each switch device being connected to a high potential side; a low potential side switch device group having a plurality of switch devices and, one end of each switch device being connected to a low potential side; an drive type selective input terminal to which a drive type selection signal corresponding to drive type of the IGBT connected to the driving device is inputted; a direct drive type control unit and an indirect drive type control unit generating a control signal controlling complementarily the high potential side switch device group and the low potential side switch device group corresponding to the drive type of the IGBT; and a selector selecting the control signal controlling the high potential side switch device group and the low potential side switch device group corresponding to an inputted drive type selection signal.

2 Claims, 11 Drawing Sheets

| drive type | direct drive 2 |
|---|---|
| ability of high speed drive | × |
| number of external parts | O[3] |
| exothermicity of drive transistor | × |
| temperature characteristic of drive circuit | × |
| judge | × |

| drive type | indirect drive 4 |
|---|---|
| ability of high speed drive | △ |
| number of external parts | ○[5] |
| exothermicity of drive transistor | △ |
| temperature characteristic of drive circuit | × |
| judge | △ | on/off control signal of IGBT

| drive type | indirect drive 2 |
|---|---|
| ability of high speed drive | × |
| number of external parts | ○[5] |
| exothermicity of drive transistor | × |
| temperature characteristic of drive circuit | × × |
| judge | × |

| drive type | indirect drive 3 |
|---|---|
| ability of high speed drive | ○ |
| number of external parts | ×[8] |
| exothermicity of drive transistor | ○ |
| temperature characteristic of drive circuit | ○ |
| judge | △ |

| drive type | indirect drive 4 |
|---|---|
| ability of high speed drive | ○ |
| number of external parts | ○[5] |
| exothermicity of drive transistor | ○ |
| temperature characteristic of drive circuit | ○ |
| judge | ○ |

DRIVING DEVICE OF VOLTAGE DRIVE TYPE SEMICONDUCTOR DEVICE

TECHNICAL FIELD OF THE INVENTION

The present invention relates to a driving device of a voltage drive type semiconductor device.

BACKGROUND ART

An IGBT (Insulated gate bipolar transistor), a MOSGTO (Metal oxide gate turn-off thyristor) or the like is a so-called voltage drive type semiconductor device which can control current by voltage applied on an insulated gate, and is widely used in a power source or an inverter with a bipolar transistor of current drive type.

In recent, that is used largely in an inverter for a hybrid electric vehicle (HEV). Following the diversification of hybrid electric vehicles, various inverters having different output current values are provided.

Generally, the capacity of transistor driving an inverter with small capacity is small, and the capacity of transistor driving an inverter with large capacity is large.

As a driving device constituting an inverter of an IGBT, a direct drive type driving device (see the Japanese Patent Laid Open Gazette 2001-223571) or an indirect drive type driving device which is current amplification type is used.

For the inverter of the IGBT with small capacity, either of the direct drive type driving device and the indirect drive type driving device is used. However, for the IGBT with large capacity, the indirect drive type driving device is often used and the direct drive type driving device is rarely used.

That is because the size of the driving device constructed to be an IC chip becomes large by building the transistor with large capacity in the chip, thereby increasing the cost. That is also because the exothermicity of the transistor for large current is large so that the radiation of heat is difficult.

As the direct drive type driving device, generally, the driving device having a MOS transistor as the switch device such as a driving device of direct drive 1 shown in FIG. 6 or the driving device having a bipolar transistor as the switch device such as a driving device of direct drive 2 shown in FIG. 7 is used.

As the indirect drive type driving device, generally, the driving device having a MOS transistor as the switch device and a bipolar transistor as the switch device for current amplification which is an external member such as a driving device of indirect drive 1 shown in FIG. 8, the driving device having a bipolar transistor as the switch device and a bipolar transistor as the switch device for current amplification which is an external member such as a driving device of indirect drive 2 shown in FIG. 9, the driving device having two external inverters connected in series each of which is constructed by a MOS transistor so as to amplify current such as a driving device of indirect drive 3 shown in FIG. 10, or the driving device having one external inverter which is constructed by a MOS transistor so as to amplify current such as a driving device of indirect drive 4 shown in FIG. 11 is used.

SUMMARY OF THE INVENTION

However, with regard to the above-mentioned driving devices, each of the driving devices of direct drive 2, indirect drive 1 and indirect drive 2 using a bipolar transistor as the switch device is bad in the ability of driving the IGBT at high speed and the exothermicity of the switch device in the driving device is large.

That is because momentary peak current supply ability of the bipolar transistor is inferior to that of the MOS transistor so that the bipolar transistor is disadvantageous in the ability of high speed drive. That is also because the bipolar transistor is a current drive device though the MOS transistor is a voltage drive device and it is necessary to keep on applying base current for driving the bipolar transistor, whereby the exothermicity is large in comparison with the MOS transistor.

Furthermore, forward direction bias voltage Vbe of the bipolar transistor has large temperature characteristic (for example, −2 mV/° C.) so that the temperature characteristic of gate voltage is also large, whereby the accuracy of gate voltage may be bad. For example, if the gate voltage is shifted downward, loss of IGBT is increased and current density is decreased. On the contrary, if the gate voltage is shifted upward, short-circuit capability of IGBT is decreased.

With regard to the driving device of indirect drive 3, the logic of the inverter is reverse in the case of input or output so that two inverters are connected in series, and it is necessary to provide resistance between the MOS transistor of high potential side and the MOS transistor of low potential side so as to prevent through current, whereby the number of parts is increased.

On the other hand, the driving device of direct drive 1 or indirect drive 4 is superior in characteristics such as the ability of high speed drive, the number of parts, the exothermicity characteristic and the temperature characteristic.

Conventionally, the IGBT with small capacity is driven by the direct drive type driving device, and the IGBT with large capacity is driven by the indirect drive type driving device. Accordingly, it is necessary to complete various direct drive type driving devices and indirect drive type driving devices corresponding to specifications of hybrid electric vehicles, whereby the number of kinds of necessary driving devices is increased.

Then, the present invention provides a driving device of a voltage drive type semiconductor device which comprises one IC chip having both the function of the driving device of direct drive 1 and the function of the driving device of indirect drive 4, is superior in the above-mentioned characteristics, and is small and cheap.

A driving device of a voltage drive type semiconductor device solving the above-mentioned problem has below features.

Namely, a driving device of a voltage drive type semiconductor device according to the present invention comprises a high potential side switch device group having a plurality of switch devices, one of ends of each switch device being connected to a high potential side; a low potential side switch device group having a plurality of switch devices, one of ends of each switch device being connected to a low potential side; an input means to which a drive type selection signal corresponding to drive type of the voltage drive type switch device connected to the driving device is inputted; a control signal generation means generating a control signal controlling complementarily the high potential side switch device group and the low potential side switch device group corresponding to the drive type of the voltage drive type switch device; and a selection means selecting the control signal controlling the high potential side switch device group and the low potential side switch device group corresponding to an inputted drive type selection signal.

Accordingly, the small and cheap driving device comprising one IC chip drives an IGBT in either of direct drive type and indirect drive type, and the IGBT can be driven in the desired drive type by changing a drive type selection signal suitably.

Therefore, only by selecting the drive type, either the IGBT with small capacity or the IGBT with large capacity can be driven by the driving device, whereby diversified specifications of a hybrid electric vehicle can be dealt with out increasing the number of kind of the driving device.

The driving device is constructed to be superior with respect to the high speed drive ability of the IGBT, the number of external members, the exothermicity of the external switch device of the driving device, and the accuracy of temperature characteristic of the gate voltage, whereby the reliability of the inverter device is improved.

Each of the switch devices comprises a MOS transistor.

Accordingly, since the MOS transistor is distributed abundantly, the high speed drive of the IGBT is obtained easily and cheaply.

BEST MODE FOR CARRYING OUT THE INVENTION

Next, the mode for carrying out the invention is explained based on attached drawings.

Explanation will be given on construction of an inverter to which a driving device of a voltage drive type semiconductor device according to the present invention is adopted.

For example, an inverter driving a three-phase motor has six pairs, each of the pairs comprising an IGBT which is a voltage drive type semiconductor device, a diode, and a driving device of the IGBT according to the present invention.

Figure 1:
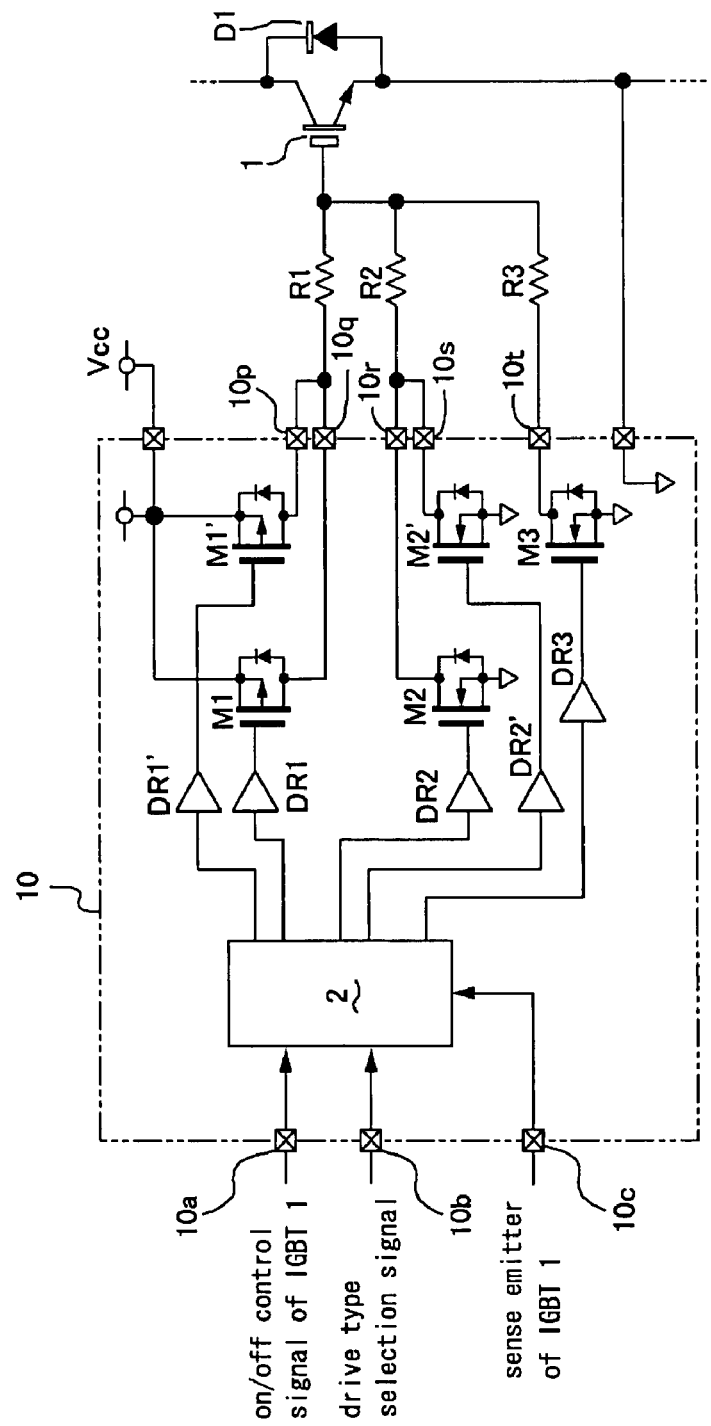
FIG. 1 is a circuit diagram of the case that a driving device of an IGBT according to the present invention is used in direct drive type.

FIG. 1 shows a block diagram of one of the six pairs, that is, a pair comprising an IGBT 1, a diode D1, and a driving device 10 of the IGBT 1.

The driving device 10 can drive the IGBT 1 while selecting one of direct drive type and indirect drive type which is current amplification type. In FIG. 1, the IGBT 1 is driven in the direct drive type.

Explanation will be given on the construction in the case that the driving device 10 drives the IGBT 1 in the direct drive type.

The driving device 10 of the IGBT 1 comprises a switch device M1 and a switch device M1' connected to the high potential side, a switch device M2 and a switch device M2' connected to the low potential side, a switch device M3 for soft-shutdown, a control circuit 2 for on/off control of the switch devices M1 and M1' and the switch devices M2 and M2', and drivers DR1, DR1', DR2 and DR2' respectively driving the switch devices M1, M1', M2 and M2'.

The switch devices M1 and M1' are constructed by PMOS transistors, and the switch devices M2, M2' and M3 are constructed by NMOS transistors.

In addition, for preventing dispersion current driving force of driving signal driving the external switch devices in the case of the indirect drive type, it is preferable that the current driving ability of the switch devices M1 and M1' is substantially the same and the current driving ability of the switch devices M2 and M2' is substantially the same.

The driving device 10 comprises an on/off signal input terminal 10a to which an on/off signal of the IGBT 1 is inputted, a drive type selective input terminal 10b switching the IGBT 1 between the direct drive type and the indirect drive type, and an overcurrent detection terminal 10c connected to a sense emitter of the IGBT 1 and detecting overcurrent.

Drain electrodes of the switch devices M1, M1', M2 and M2' are respectively connected to output electrodes 10p, 10q, 10r and 10s of the driving device 10.

In the case of driving the IGBT 1 by the direct drive type, the output electrodes 10p and 10q connected to the switch devices M1 and M1' are connected to the gate electrode of the IGBT 1 through gate resistance R1. The output electrodes 10r and 10s connected to the switch devices M2 and M2' are connected to the gate electrode of the IGBT 1 through gate resistance R2. An output electrode 10t connected to the switch device M3 is connected to the gate electrode of the IGBT 1 through gate resistance R3.

The diode D1 is connected to the IGBT 1 in parallel.

Figure 2:
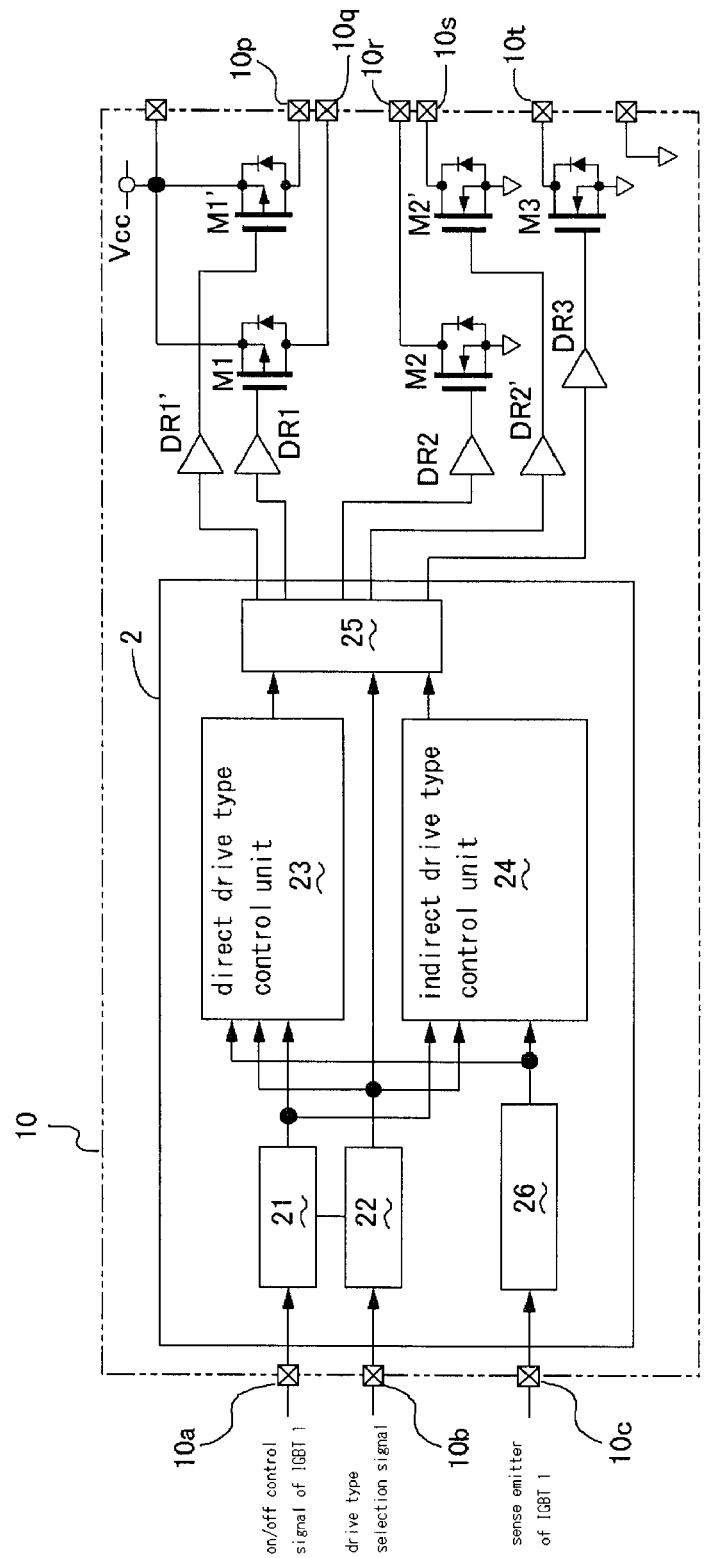
FIG. 2 is a circuit diagram of a control circuit of the driving device of the IGBT.

As shown in FIG. 2, the control circuit 2 comprises a direct drive type control unit 23 generating a control signal for the direct drive type, a indirect drive type control unit 24 generating a control signal for the indirect drive type, a selector 25 selecting one of the control signal from the direct drive type control unit 23 and the control signal from the indirect drive type control unit 24 and outputting it to the switch devices M1, M1', M2 and M2', an input circuit 21 inputting an on/off signal from the on/off signal input terminal 10a into the direct drive type control unit 23 and the indirect drive type control unit 24, an input circuit 22 inputting a drive type selection signal from the drive type selective input terminal 10b into the direct drive type control unit 23, the indirect drive type control unit 24 and the selector 25, and an overcurrent detection circuit 26 detecting the overcurrent of the IGBT 1 by the input from the overcurrent detection terminal 10c and outputting the detected result into the direct drive type control unit 23 and the indirect drive type control unit 24.

With regard to the driving device 10 constructed as the above, the drive of the IGBT 1 in the direct drive type is performed as discussed below.

Figure 3:
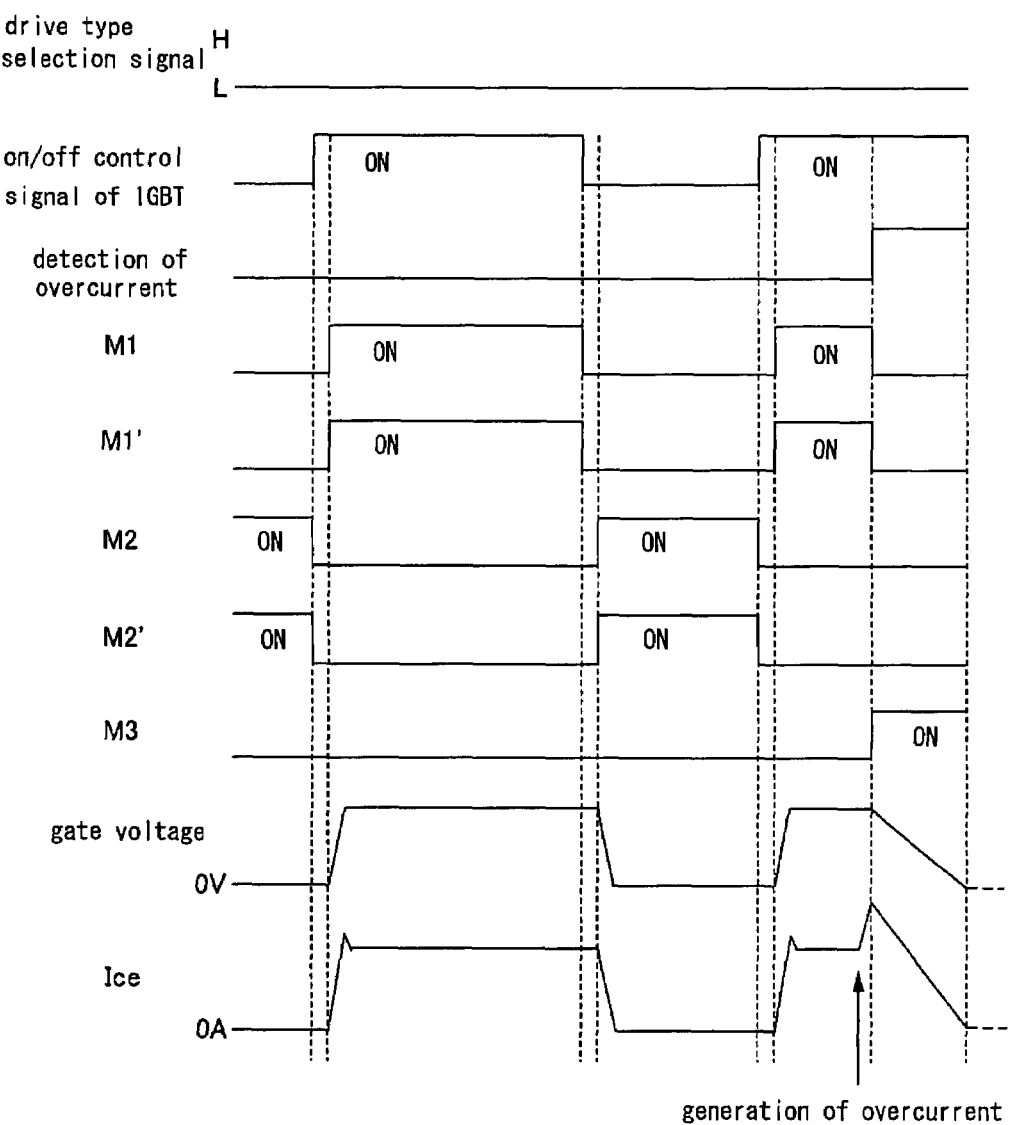
FIG. 3 is a timing chart of the case that of the driving device of the IGBT is used in direct drive type.

As shown in the timing chart of FIG. 3, firstly, the drive type selection signal indicating the direct drive type (in this embodiment, "L") is inputted into the drive type selective input terminal 10b, and the on/off control signal of the IGBT 1 is inputted into the on/off signal input terminal 10a.

When the drive type selection signal and the on/off control signal are inputted into the driving device 10, the direct drive type control unit 23 generates control signals for the switch devices M1 and M1' and the switch devices M2 and M2'.

In this case, dead time DT of the switch devices M1, M1', M2 and M2' is also generated simultaneously.

The control signal generated by the direct drive type control unit 23 is outputted to the drivers DR1, DR1', DR2 and DR2', and the drivers DR1, DR1', DR2 and DR2' on/off-drive the switch devices M1, M1', M2 and M2'.

In this case, the switch devices M1 and M1' are on/off-driven simultaneously and actuated as one PMOS transistor. Similarly, the switch devices M2 and M2' are on/off-driven simultaneously and actuated as one NMOS transistor.

When the drive type selection signal indicating the direct drive type is inputted, in the control circuit 2, the selector 25 selects the control signal from the direct drive type control unit 23 from the signals generated by the direct drive type control unit 23 and the indirect drive type control unit 24, and then the selected signal is outputted to the drivers DR1, DR1', DR2 and DR2'.

Accordingly, the IGBT 1 is driven by the switch devices M1 and M1' actuated as one PMOS transistor and the switch devices M2 and M2' actuated as one NMOS transistor. The actuation timing of the switch devices M1 and M1' and the actuation timing of the switch devices M2 and M2' are shifted from each other so as to provide the dead time DT, thereby preventing through current flowing between the switch devices M1 and M1' and the switch devices M2 and M2'.

When overcurrent is generated in collector current Ice of the IGBT 1, the overcurrent is detected by the overcurrent detection circuit 26, and the direct drive type control unit 23 turn off all of the switch devices M1 and M1' and the switch devices M2 and M2' and turn on the switch device M3.

In this case, the gate resistance R3 is enough large in comparison with the gate resistances R1 and R2 so that the gate voltage is discharged gradually, whereby the IGBT 1 is soft-shut down.

By the gradual discharge of gate voltage, the rate of change with time of overcurrent dIce/dt is decreased so as to restrain surge voltage.

Furthermore, the function that the enough large gate resistance R3 restricts through current is provided so that it is not necessary to provide the dead time by shifting the drive timings of the switch devices M1 and Ml' and the switch device M3 from each other.

Figure 4:
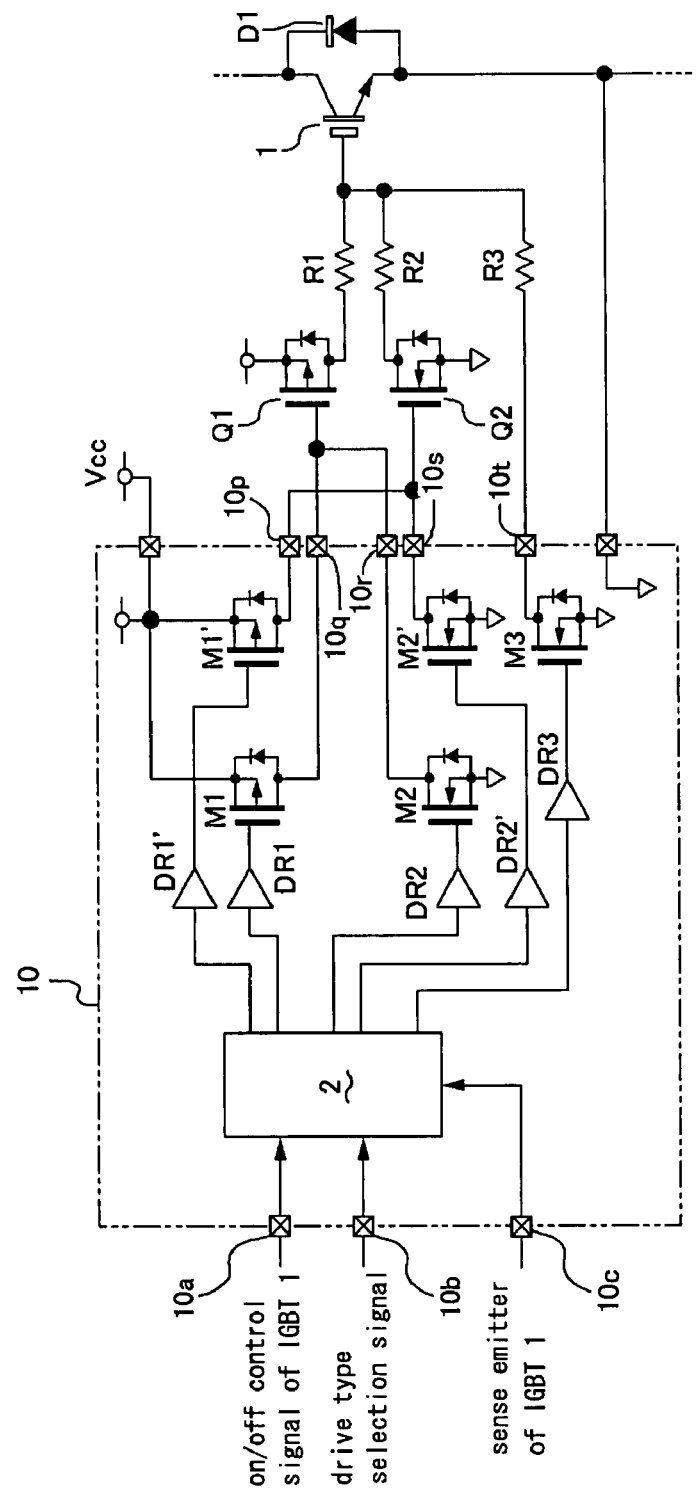
FIG. 4 is a circuit diagram of the case that the driving device of the IGBT is used in indirect drive type.

Next, the construction of the drive of the IGBT 1 by the driving device 10 in the indirect drive type is shown in FIG. 4.

In the case of driving the IGBT 1 in the indirect drive type, the driving device 10 and the IGBT 1 are connected to each other through external switch devices Q1 and Q2 and the gate resistances R1, R2 and R3.

The external switch device Q1 is constructed by a PMOS transistor, and the external switch device Q2 is constructed by a NMOS transistor.

The output terminals 10q and 10r of the driving device 10 are connected to the gate electrode of the external switch device Q1, and the output terminals 10p and 10s are connected to the gate electrode of the external switch device Q2.

The drain electrode of the external switch device Q1 is connected to the gate electrode of the IGBT 1 through the gate resistance R1, and the drain electrode of the external switch device Q2 is connected to the gate electrode of the IGBT 1 through the gate resistance R2.

Furthermore, the output terminal 10t is connected to the gate electrode of the IGBT 1 through the gate resistance R3.

With regard to the driving device 10 connected to the IGBT 1 as mentioned above, the drive of the IGBT 1 by the indirect drive type is performed as discussed below.

Figure 5:
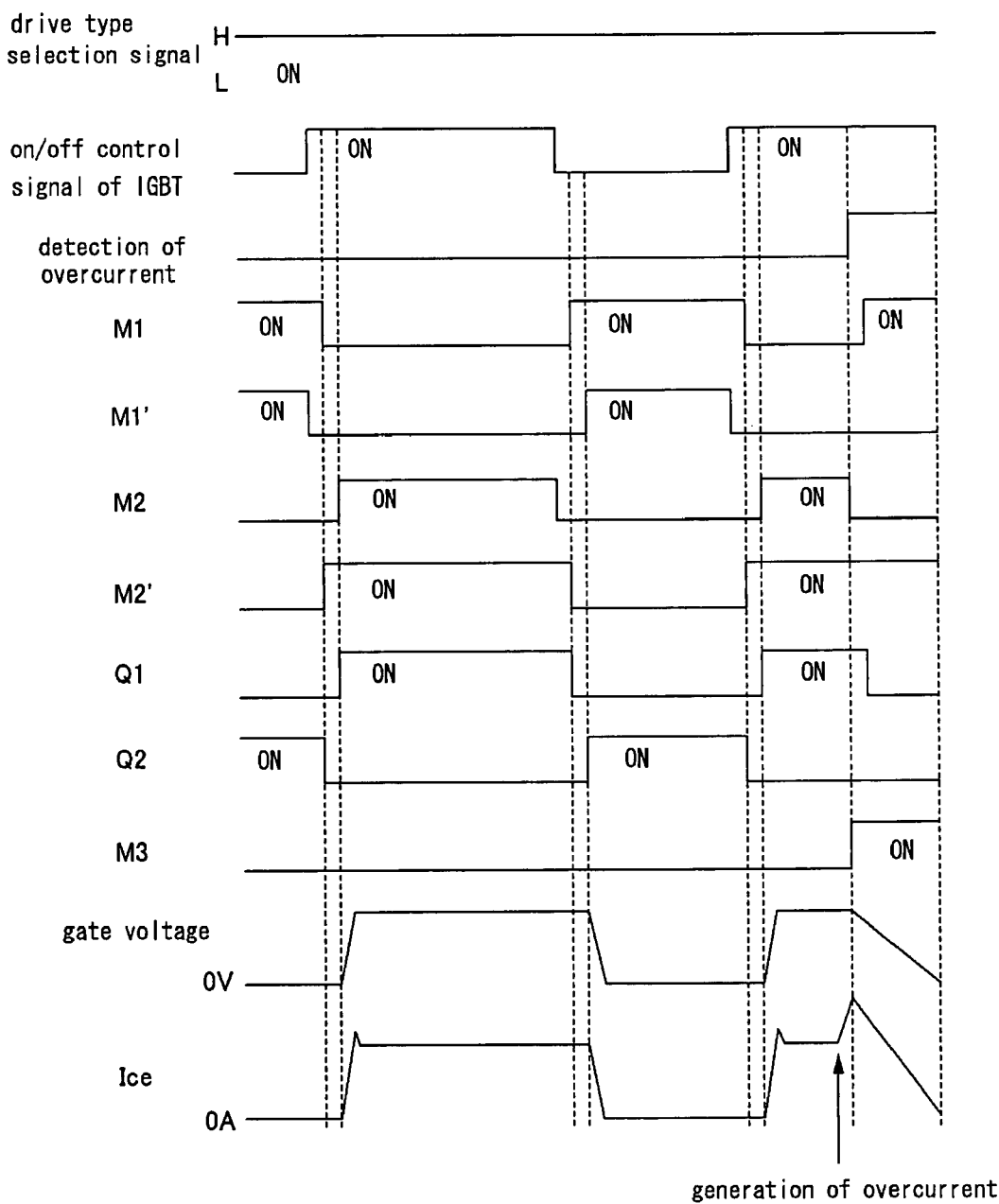
FIG. 5 is a timing chart of the case that of the driving device of the IGBT is used in indirect drive type.

As shown in the timing chart of FIG. 5, firstly, the drive type selection signal indicating the indirect drive type (in this embodiment, "H") is inputted into the drive type selective input terminal 10b, and the on/off control signal of the IGBT 1 is inputted into the on/off signal input terminal 10a.

When the drive type selection signal and the on/off control signal are inputted into the driving device 10, the indirect drive type control unit 24 generates control signals for the switch devices M1 and M1' and the switch devices M2 and M2'.

In this case, dead time DT of the switch devices M1, M1', M2 and M2' is also generated simultaneously.

The control signal generated by the indirect drive type control unit 24 is outputted to the drivers DR1, DR1', DR2 and DR2', and the drivers DR1, DR1', DR2 and DR2' on/off-drive the switch devices M1, M1', M2 and M2'.

In this case, the inverter constructed by the switch device M1 and the switch device M2 is actuated as a drive circuit of the external switch device Q1, and the inverter constructed by the switch device M1' and the switch device M2' is actuated as a drive circuit of the external switch device Q2.

When the drive type selection signal indicating the direct drive type is inputted, in the control circuit 2, the selector 25 selects the control signal from the indirect drive type control unit 24 from the signals generated by the direct drive type control unit 23 and the indirect drive type control unit 24, and then the selected signal is outputted to the drivers DR1, DR1', DR2 and DR2'.

For preventing through current flowing between the switch devices M1 and M2, between the switch devices M1' and M2', and between the external switch device Q1 and the external switch device Q2, the actuation timings of these switch devices are shifted from each other so as to provide the dead time DT as shown in FIG. 5.

Accordingly, through current between the external switch device Q1 and the external switch device Q2 is prevented certainly without providing another members, whereby abnormal exothermicity of the external switch devices Q1 and Q2 is prevented and the reliability of the inverters is improved.

When overcurrent generated in collector current Ice of the IGBT 1 is detected by the overcurrent detection circuit 26, the indirect drive type control unit 24 controls the external switch devices Q1 and Q2 turn off the switch devices M1 and M1' and the switch devices M2 and M2'.

Namely, the switch device M1 is turned on and the switch device M2 is turned off, and the switch device M1' is turned off and the switch device M2' is turned on.

Simultaneously, the switch device M3 is turned on.

In this case, the gate resistance R3 is enough large in comparison with the gate resistances R1 and R2 so that the gate voltage is discharged gradually, whereby the IGBT 1 is soft-shut down.

By the gradual discharge of gate voltage, the rate of change with time of overcurrent dIce/dt is decreased so as to restrain surge voltage.

Furthermore, the function that the enough large gate resistance R3 restricts through current is provided so that it is not necessary to provide the dead time by shifting the drive timings of the external switch device Q1 and the switch device M3 from each other.

Accordingly, the driving device 10 constructed to be one chip can drive the IGBT 1 by either of the direct drive type and the indirect drive type. By changing the drive type selection signal to be inputted into the drive type selective input terminal 10b suitably, the IGBT 1 can be driven in the desired drive type.

Figure 6:
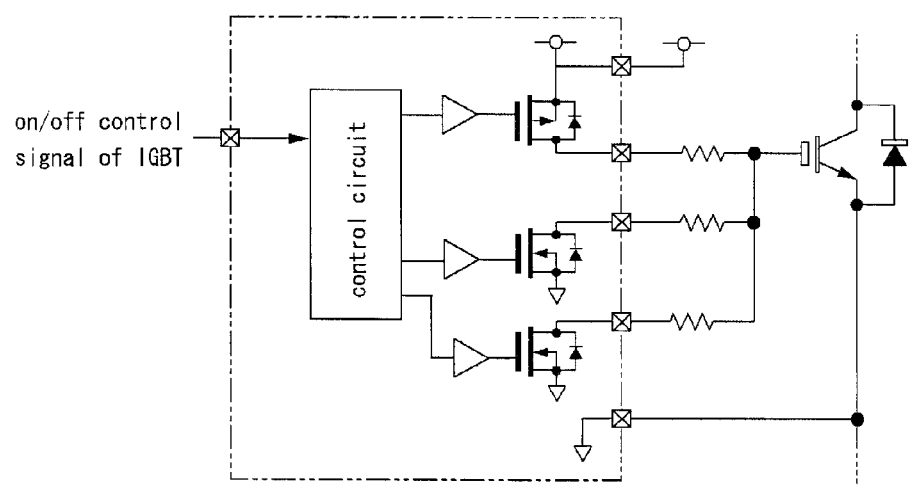
FIG. 6 is a diagram of circuit and characteristics of a first embodiment of a conventional direct drive type driving device.
Figure 11:
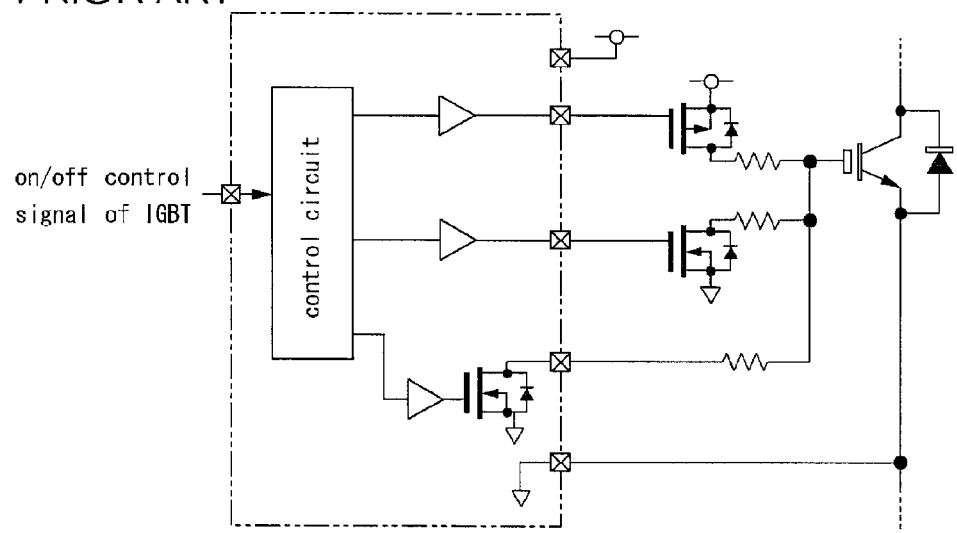
FIG. 11 is a diagram of circuit and characteristics of a fourth embodiment of a conventional indirect drive type driving device.

In the case of using in the direct drive type, the driving device 10 is actuated with the construction similar to the conventional driving device of direct drive 1 shown in FIG. 6. In the case of using in the indirect drive type, the driving device 10 is actuated with the construction, having only two external switch devices Q1 and Q2, similar to the conventional driving device of amplification drive 4 shown in FIG. 11.

Accordingly, the driving device 10 can drive either of an IGBT with small capacity and an IGBT with large capacity only by selecting the drive type, thereby dealing with diversified specifications of a hybrid electric vehicle without providing another kind of driving devices.

In the case of either of the direct drive type and the indirect drive type, any bipolar transistor is not required and only MOS transistors distributed abundantly are used as the switch devices of the driving device 10 and the switch devices for current amplification which are external member, whereby the IGBT 1 can be driven at high speed easily cheaply.

Exothermicity is restrained by using the MOS transistors so that a wide use IC package which is cheap and small can be used, whereby the driving device 10 can be miniaturized and the cost thereof can be reduced.

In the case of the direct drive type, when the on-voltage of the switch devices M1 and M1' is referred to as VDS(on)M1, the gate drive voltage of the IGBT 1 is Vcc-VDS(on)M1. Similarly, in the case of the indirect drive type, when the on-voltage of the external switch device Q1 is referred to as VDS(on)Q1, the gate drive voltage of the IGBT 1 is Vcc-VDS(on)Q1.

When the gate charge of the IGBT 1 is finished and the state becomes to be stationary, each of Vcc-VDS(on)M1 and Vcc-VDS(on)Q1 is substantially zero, whereby the gate voltage of the IGBT 1 depends on only Vcc.

Then, in the case of either of the direct drive type and the indirect drive type, the temperature characteristic of gate voltage of the driving device 10 is substantially zero, whereby the accuracy of gate voltage is improved.

Accordingly, short-circuit capability can be secured while improving current density of the IGBT 1, whereby the inverter can be miniaturized and the cost thereof can be reduced.

Figure 7:
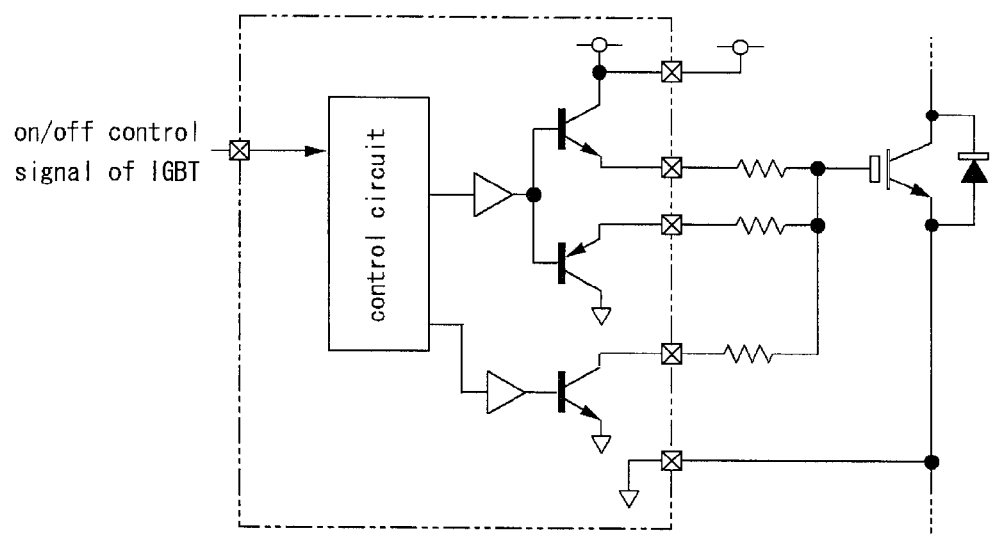
FIG. 7 is a diagram of circuit and characteristics of a second embodiment of a conventional direct drive type driving device.

As the above mentioned, in the case that the driving device 10 is used in the direct drive type, the driving device 10 is superior to the conventional driving device of direct drive 2 shown in FIG. 7 in points of the high speed drive ability of the IGBT 1, the exothermicity of the external switch device of the driving device 10, and the accuracy of temperature characteristic of the gate voltage.

Figure 8:
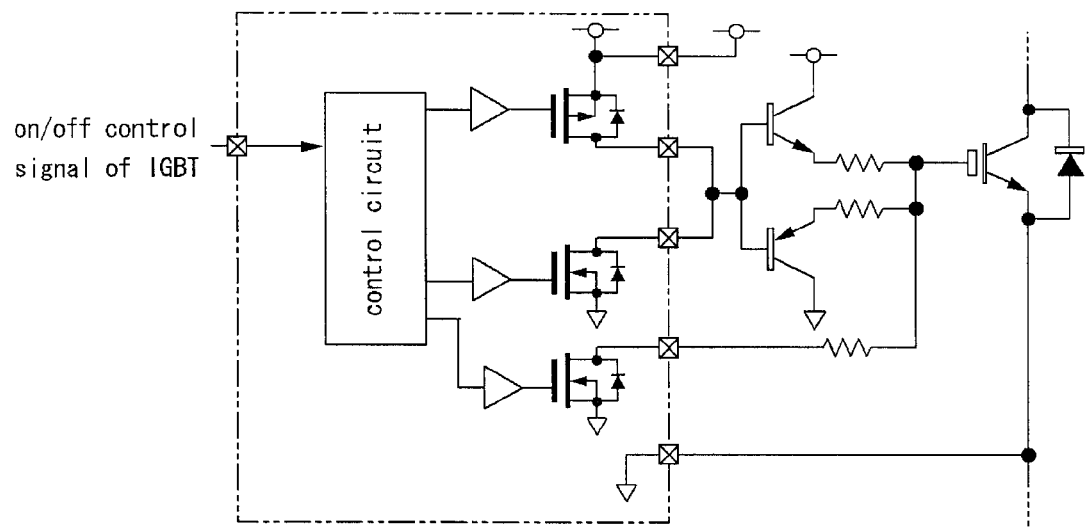
FIG. 8 is a diagram of circuit and characteristics of a first embodiment of a conventional indirect drive type driving device.
Figure 9:
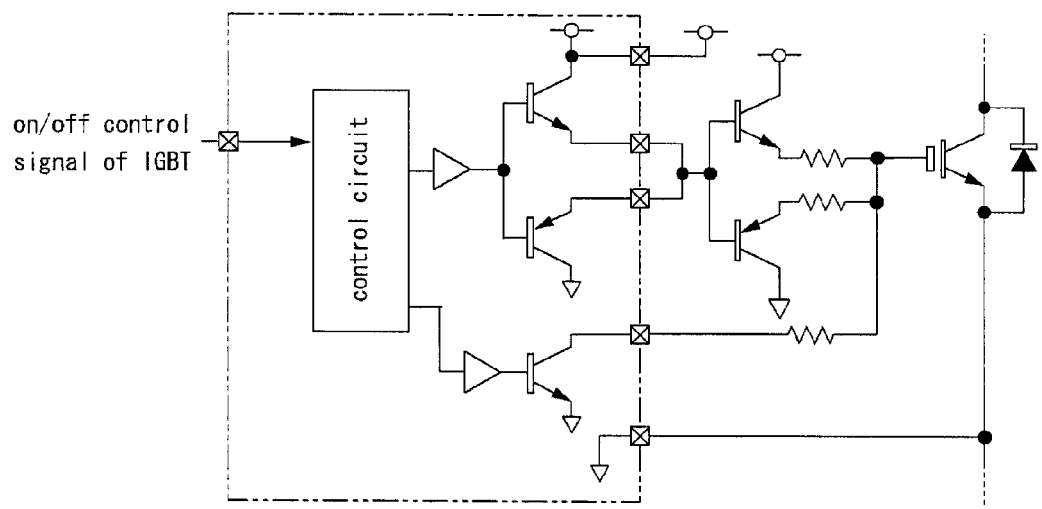
FIG. 9 is a diagram of circuit and characteristics of a second embodiment of a conventional indirect drive type driving device.
Figure 10:
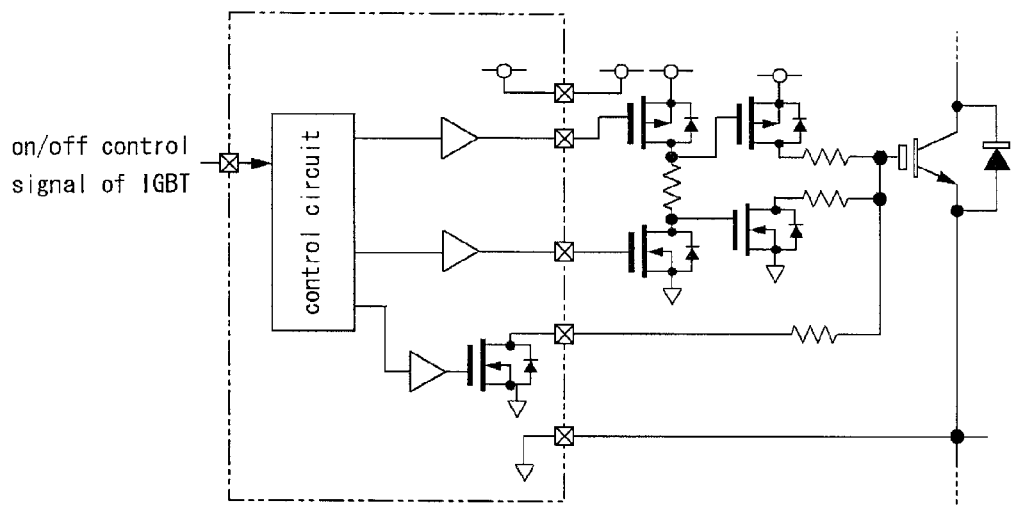
FIG. 10 is a diagram of circuit and characteristics of a third embodiment of a conventional indirect drive type driving device.

In the case that the driving device 10 is used in the indirect drive type, the driving device 10 is superior to either of the conventional indirect drives 1, 2 and 3 shown in FIGS. 8 to 10 with respect to the high speed drive ability of the IGBT 1, the number of external members, the exothermicity of the external switch device of the driving device 10, and the accuracy of temperature characteristic of the gate voltage synthetically.

Furthermore, with respect to the soft-shut down, each of the conventional driving devices shown in FIGS. 8 to 10 is difficult to turn off all of the external switch devices. Otherwise, an exclusive circuit may be required for turning off all of the external switch devices certainly. However, with regard to the driving device 10 according to the present invention, each of the external switch devices Q1 and Q2 is driven independently so as to be turned off certainly. Accordingly, the soft-shut down is performed stably, thereby improving the reliability of the inverter device.

In addition, the construction divided one switch device into two as the pair of the switch devices M1 and M1' or the pair of the switch devices M2 and M2' used as one switch device in the case of the direct drive type does not increases the size of the IC chip of the driving device 10 in comparison with the conventional driving device of direct drive 1 shown in FIG. 6.

The factors causing the increase of the size of the IC chip of the driving device 10 in comparison with the conventional driving device of direct drive 1 are the addition of the drivers DR1' and DR2' of the switch devices M1' and M2', the drive type selective input terminal 10b, and the output terminals 10p and 10s, and the addition of function of the indirect drive type control unit 24 and the like of the control circuit 2. The increase is restrained to be slight.

Accordingly, the construction hardly prevents the miniaturization and cost reduction of the inverter device.

INDUSTRIAL APPLICABILITY

The present invention is applicable for driving an IGBT, a MOSGTO or the like used in a power source or an inverter, especially for driving an inverter of a hybrid electric vehicle.

The invention claimed is:

1. A driving device of a voltage drive type semiconductor device comprising:
   a high potential side switch device group having a plurality of switch devices, one of ends of each switch device being connected to a high potential side;
   a low potential side switch device group having a plurality of switch devices, one of ends of each switch device being connected to a low potential side;
   a direct drive type control unit generating a control signal of direct drive type in the case of using the driving device in direct drive type that an output of the driving device is inputted to the voltage drive type semiconductor device without interposing any external switch device so as to drive the voltage drive type semiconductor device;
   an indirect drive type control unit generating a control signal of indirect drive type in the case of using the driving device in indirect drive type that an output of the driving device is inputted to the voltage drive type semiconductor device through an external switch device so as to drive the voltage drive type semiconductor device;
   a selector selecting one of the control signal from the direct drive type control unit and the control signal from the indirect drive type control unit and inputting it to the high potential side switch device group and the low potential side switch device group complementally;
   a first input means inputting an on/off signal of the driving device to the direct drive type control unit and the indirect drive type control unit; and
   a second input means inputting a drive type selection signal, for driving the driving device in either of direct drive type and indirect drive type, to the direct drive type control unit, the indirect drive type control unit and the selector.

2. The driving device as set forth in claim 1, wherein each of the switch devices comprises a MOS transistor.

* * * * *